United States Patent [19]
Barsanti et al.

[11] Patent Number: 5,138,200
[45] Date of Patent: Aug. 11, 1992

[54] DEVICE FOR GENERATING A REFERENCE VOLTAGE FOR A SWITCHING CIRCUIT INCLUDING A CAPACITIVE BOOTSTRAP CIRCUIT

[75] Inventors: Andrea Barsanti, Pisa; Claudio Diazzi; Fabio Vio, both of Milan, all of Italy

[73] Assignee: SGS-Thomson Microelectronics S.r.l., Agrate Brianza, Italy

[21] Appl. No.: 423,288

[22] Filed: Oct. 18, 1989

[30] Foreign Application Priority Data

Oct. 28, 1988 [IT] Italy .................. 22466 A/88

[51] Int. Cl.⁵ .................................................. H03K 17/10
[52] U.S. Cl. ................................. 307/482; 307/475
[58] Field of Search .......... 307/482, 578, 270, 475, 307/450, 601, 603, 443; 328/172, 173, 176; 326/4911 W, 4912 T, 4913 E

[56] References Cited

U.S. PATENT DOCUMENTS

| | | | |
|---|---|---|---|
| 3,787,736 | 1/1974 | Chin | 307/482 X |
| 4,612,462 | 9/1986 | Asano et al. | 307/482 |
| 4,622,479 | 11/1986 | Taylor | 307/578 X |
| 4,680,488 | 7/1987 | Okumura et al. | 307/482 |
| 4,725,746 | 2/1988 | Segawa et al. | 307/482 |
| 4,806,798 | 2/1989 | Kanauchi | 307/482 X |
| 4,814,647 | 3/1989 | Tran | 307/578 X |
| 4,965,696 | 10/1990 | Kumpfmueller et al. | 307/482 X |
| 5,010,259 | 4/1991 | Inoue et al. | 307/482 |

*Primary Examiner*—David Hudspeth
*Attorney, Agent, or Firm*—Guido Modiano; Albert Josif

[57] ABSTRACT

This device for generating a reference voltage for a capacitive bootstrap circuit of an output stage can be easily integrated. The output stage comprises a driving block, a capacitive bootstrap circuit and a reference voltage generating block generating a floating reference voltage which is referred to the output voltage signal and switches in accordance thereto.

11 Claims, 2 Drawing Sheets

DEVICE FOR GENERATING A REFERENCE VOLTAGE FOR A SWITCHING CIRCUIT INCLUDING A CAPACITIVE BOOTSTRAP CIRCUIT

BACKGROUND OF THE INVENTION

The present invention relates to a device for generating a reference voltage for a switching circuit including a driving block controlled by an input switching signal and a capacitive bootstrap circuit, in particular for an output stage.

As is known, transistors implemented in MOS technology are often used to manufacture output stage circuits. Such output stages comprise N-channel MOS transistors which are driven by a high supply voltage, the drain of said tansistors being connected to a positive supply line.

It is also known that a problem which occurs with such outut stages is that of ensuring a correct driving voltage for the gate electrode of the MOS tansistors, so as to ensure the operation of the device as a low-resistance switch (with a gate-source voltage $V_{GS}$ above 10 V).

To this end, a capacitive bootstrap circuit is provided. An example of a prior art applied to a half-bridge is shown in FIG. 1; said circuit comprises capacitive bootstrap circuitry and output stage circuitry, the output stage being driven so as to generate a periodic wave-form signal $V_{OUT}$ which oscillates between a low voltage, which is about 0 V in the example being considered, and a high voltage substantially equal to a firsst supply voltage $V_{CC}$.

In particular, two output transistors $T_1$ and $T_2$ are provided in order to generate the periodic wave-form signal and are driven by two driving elements DR.

According to the input signal $V_{IN}$, said two transistors $T_1$ and $T_2$ are alternately switched in the ON and OFF state so that the output signal switches between the low voltage of 0 V and the high voltage $V_{CC}$.

The bootstrap circuitry substantially comprises two elements, i.e. the bootstrap capacitor $C_B$ and the bootstrap diode $D_B$. When the transistor $T_1$ is off and the transistor $T_2$ is on, $V_{OUT}$ is connected to the ground and therefore is in the LOW state.

In this condition, the bootstrap capacitor $C_B$ is charged through the bootstrap diode $D_B$ at a voltage equal to the difference between a second supply voltage, for example 12 V, and the voltage drop across the bootstrap diode $D_B$.

In the reverse condition, i.e. with the transistor $T_1$ in the ON state and the transistor $T_2$ in the OFF state, the potential of the source electrode of the transistor $T_1$ rises toward the value of the first reference voltage $V_{CC}$, and the bootstrap capacitor maintains the supply to the driving elements DR at about $V_{CC} + 12$ V.

As can be seen, in this stage the bootstrap diode is reverse, biased, and its reverse biasing voltage is equal to the first supply voltage ($V_{CC}$), thus decoupling the bootstrap capacitor from the second supply voltage.

The problem which arises in the above described circuit is that of satisfying two contrasting requirements.

In fact, an output signal having a good dynamic behavior (i.e. considerable amplitude) is required on one hand, while on the other hand it must be possible to integrate the bootstrap diode.

In order to satisfy the first of the above mentioned requirements, the bootstrap diode $D_B$ must have a high breakdown voltage, since, as said, when the output voltage $V_{OUT}$ is high, the diode $D_B$ has applied thereto a reverse biasing voltage which is equal to the first reference voltage $V_{CC}$. This condition is troublesome (in view of the required integration) when the required breakdown voltage of the diode is in the range of hundreds of volts.

On the other hands, in the direct biasing state, the bootstrap diode must have low losses toward the substrate. This is a problem when the diode is implemented by a base to collector junction in order to have high breakdown: in fact in this case the diode is associated with a parasitic vertical PNP transistor.

Therefore the problem arises that it is difficult to integrate a small size diode with a high breakdown and low current losses toward the substrate, and this problem becomes the bigger, the higher is the supply voltage $V_{CC}$.

SUMMARY OF THE INVENTION

Therefore, the aim of the present invention is to provide a device for generating a reference voltage for a bootstrap circuit, in particular for an output stage, which allows said output stage to generate and supply at the output a high-amplitude voltage signal.

Within this aim, a particular object of the present invention is to provide a device which can be easily integrated and can be manufactured with conventional technologies, i.e. bipolar or MOS technology.

Another object of the present invention is to provide a device for generating a reference voltage for the bootstrap circuit which is able to eliminate the problems associated with a high breakdown voltage and affecting the prior art.

Not least object of the present invention is to provide an integrated device producible with conventional methods, as mentioned above, can be obtained at a cost which is relatively low and in any case comparable to that of known similar circuits.

The above described aim and objects, as well as others which may become apparent hereinafter, are achieved by a device for generating a reference voltage for a bootstrap circuit having the features of the characterizing part of claim 1.

BRIEF DESCRIPTION OF THE DRAWINGS

The characteristics and advantages of the invention will become apparent from the following detailed description of a preferred but not exclusive embodiment of the present invention, illustrated only by way of non-limitative example in the accompanying drawings, wherein.

DESCRIPTION OF THE PREFERRED EMBODIMENTS

Figure 2:
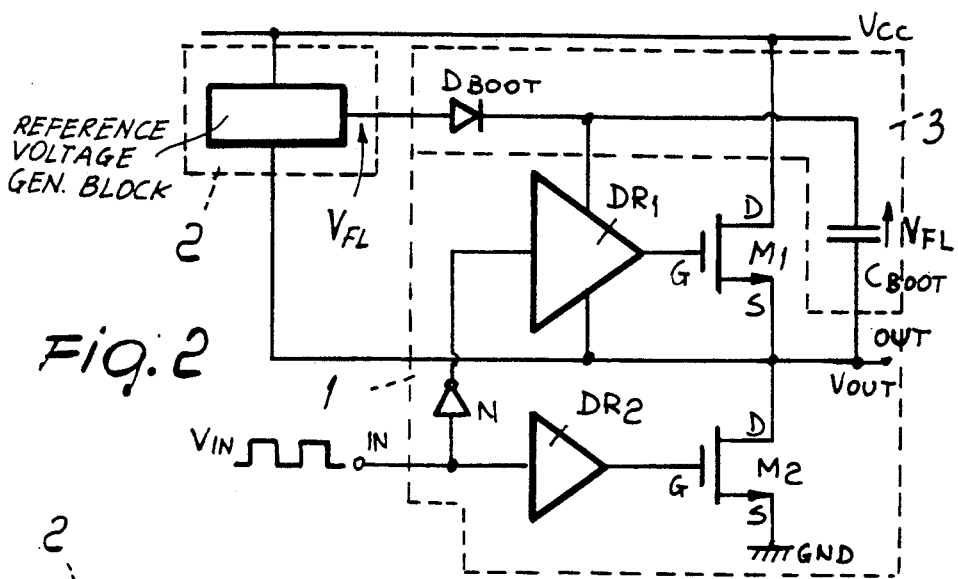
FIGS. 2 is a block diagram of the output stage and of the bootstrap circuit according to the teachings of the present invention.

With specific reference to FIG. 2, the output stage comprises a driving block 1, a reference voltage generating block 2 and a bootstrap circuit 3.

In particular, the driving block 1 has an input IN receiving a switching input signal $V_{IN}$, having for example a square wave-form, and an output OUT supplying output voltage $V_{OUT}$.

Said input switching signal is sent to the input of a driving element DR2 and the same switching signal is also sent to a further driving element DR1 after being inverted by an inverter element indicated at N.

The outputs of the driving elements are applied to the gate electrodes of first switching transistors M1 and a second switching transistor M2; more specifically, the output of the driving element DR2 is applied to the gate electrode of the switching transistor M2 while the output of the driving element DR1 is applied to the gate electrode of the first switching transistor M1.

Figure 1:
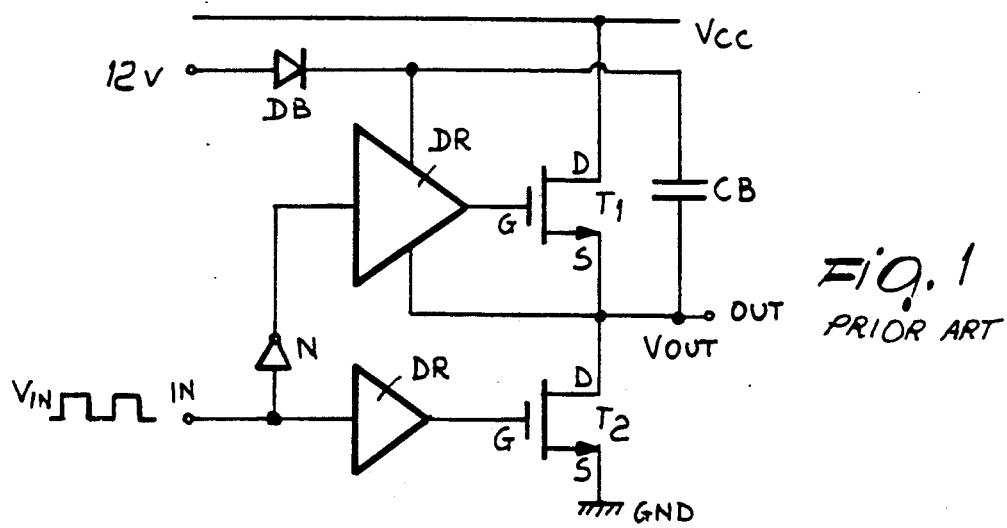
FIG. 1 is a circuit diagram of an output stage with a prior art bootstrap circuit.

As is apparent, the switching transistors illustrated in FIG. 1 are manufactured with MOS technology, but this must not be regarded as a limitation, since said transistors may naturally be manufactured according to any other conventional technology.

As can be seen, the source electrode of the first transistor M1 is connected to the drain electrode of the second transistor M2 so as to supply said output OUT, while the source electrode of the second transistor M2 is connected to the ground and the drain electrode of the transistor M1 is connected to a first supply voltage indicated at $V_{CC}$.

The output signal $V_{OUT}$ is feedback to said reference voltage block 2 and said bootstrap circuit 3; said reference voltage block 2 is also connected to the first supply voltage line $V_{CC}$ and feeds a reference voltage $V_{FL}$ to the bootstrap diode $D_{BOOT}$ and to be bootstrap capacitor $C_{BOOT}$.

According to the invention, reference voltage $V_{FL}$ is floating and referred to the output voltage $V_{OUT}$, and more precisely $V_{FL}$ follows the output voltage $V_{OUT}$ so as to have a convenient charging level for the bootstrap capacitor $C_{BOOT}$ when the output is low (near 0 V) and to have a high level (about $V_{CC}$) when the output is high. Therefore, when the output is low, the bootstrap capacitor can be charged at the desired level, while when the output is high, the voltage drop across the bootstrap diode $D_{BOOT}$ is low. Therefore, this diode may be easily integrated with low losses (e.g. by the emitter to base junction), while allowing the output stage to supply an output signal having high dynamics.

Figure 3:
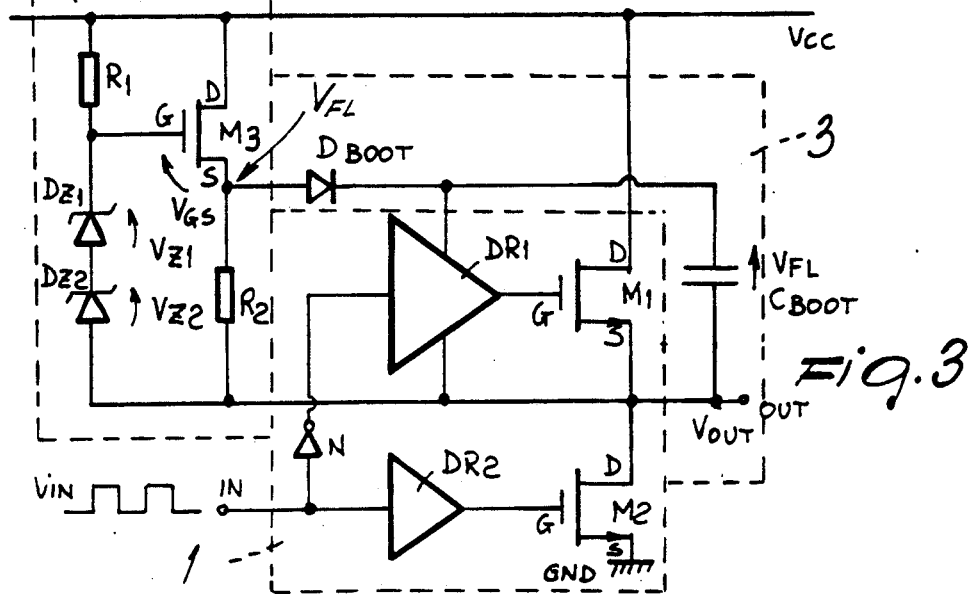
FIG. 3 is a circuit diagram of an embodiment of the present invention, implemented in MOS technology.

FIGS. 3 illustrates in detail a possible implementation of the reference voltage generating block 2.

As illustrated, said block comprises two Zener diodes, more specifically a first zener diode $DZ_1$ and a second Zener diode $DZ_2$, having respective Zener voltages $V_{Z1}$ and $V_{Z2}$; said Zener diodes are mutually connected in series, with the anode of the diode second Zener diode $DZ_2$ being connected to the output OUT and the cathode thereof being connected to the anode of the first Zener diode $DZ_1$.

Said circuit furthermore comprises a third transistor M3 preferably of the MOS type, the drain electrode whereof is connected to the first supply voltage line $V_{CC}$; its gate electrode is connected to the cathode of the first Zener diode $DZ_1$ and its source electrode is connected to the output OUT through a resistor $R_2$.

As can be seen, a further resistor $R_1$ is interposed between the gate electrode of the third transistor M3 and the first supply voltage line $V_{CC}$.

The source electrode S of the transistor M3 is also connected to the anode of the bootstrap diode $D_{BOOT}$, to supply the floating reference voltage $V_{FL}$, which, as said, is referred to the output.

In fact, when the input signal $V_{IN}$ causes the second transistor M2 to switch on, the first transistor M1 is off. The output voltage $V_{OUT}$ is low, since the point OUT is connected to the ground, and the bootstrap capacitor $C_{BOOT}$ is charged, through the bootstrap diode, to the voltage level of the source electrode of the third transistor M3, i.e. to the value $V_{FL}$ which is now equal to $V_{Z1}+V_{Z2}-V_{GS}$ ($V_{GS}$ being the gate-source voltage of the third transistor M3 which is on in this operating mode).

By appropriately selecting the Zener diodes, the voltage $V_{FL}$ may be in the range of 12 V, like the second supply voltage, as is known in the art.

Thus, the bootstrap capacitor charges at a voltage which is equal to the floating voltage $V_{FL}$.

Vice versa, when the input signal $V_{IN}$ causes the second transistor M2 to switch off and the first transistor M1 on, the potential of the output OUT starts to rise toward the value of the first reference voltage line $V_{CC}$, and the bootstrap capacitor maintains a constant voltage equal to the previous value of the floating voltage $V_{FL}$ so as to increase the supply of the driving elements.

Since the floating voltage $V_{FL}$ is always related to the output voltge $V_{OUT}$, until said output voltage $V_{OUT}$ remains lower than the first reference voltage $V_{CC}$, the bootstrap diode is directly biased, and the problem of breakdown cannot therefore occur.

Vice versa, when the output voltage $V_{OUT}$ reaches a value proximate to that of the reference voltage $V_{CC}$, the third transistor M3 switches off, since the voltage across its drain and source electrodes becomes substantially equal to 0 V.

In this condition, the anode of the bootstrap diode is connected through $R_2$ to the output voltage $V_{OUT}$ and is thus reversely biased; but the reverse voltage across said diode is now equal to 12 V, thus avoiding the problems due to the high breakdown voltage which are characteristic of the prior art.

As is evident from the preceding description, the invention fully achieves the intended aim and objects.

A circuit structure has in fact been provided which has, on one hand, no problems in integration, since the voltage between the anode and the cathode of the bootstrap diode during the diode reverse-biasing is low, and has, on the other hand, an output voltage with a high maximum or peak value, since value is equal to the first supply voltage $V_{CC}$.

Therefore, the diode is not required to have a high breakdown voltage and thus may be implemented by the emitter-base junction, which has no vertical PNP parasitic transistors associated therewith.

The invention as described is susceptible to numerous modifications and variations, all of which are within the scope of the inventive concept.

Figure 4:
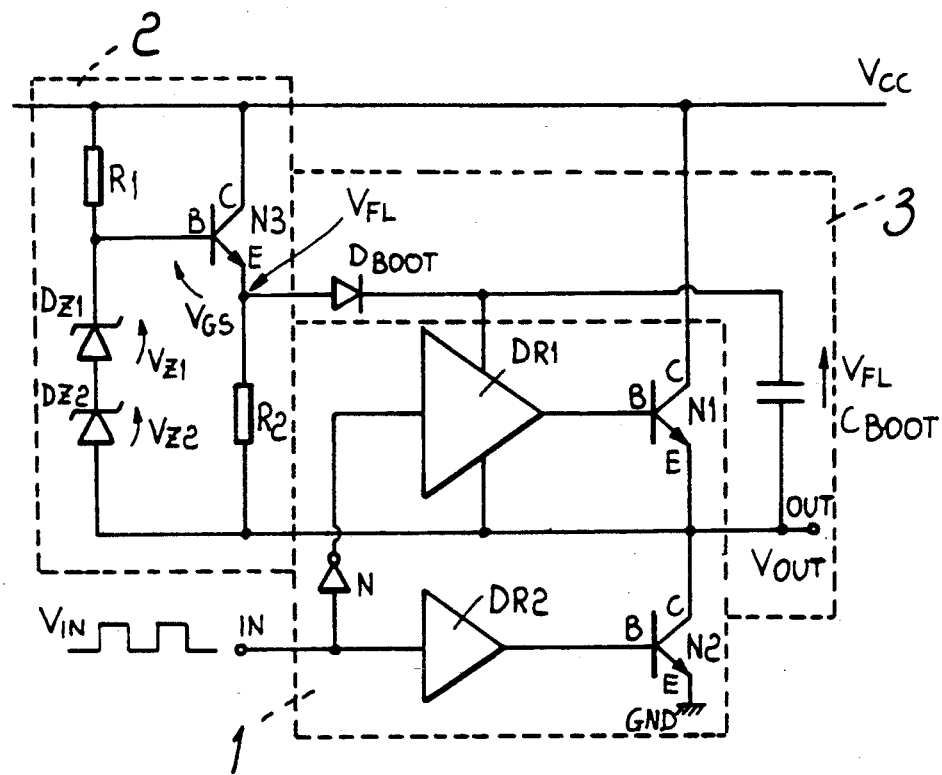
FIG. 4 is a circuit diagram of a further embodiment of the present invention, implemented in bipolar technology.

In particular, the fact is stressed that though the described circuit structure has been implemented in MOS technology, the MOS transistors may naturally be replaced with bipolar transistors, for example of the NPN type. FIG. 4 illustrates the above-mentioned bipolar implementation of the circuit shown in FIG. 3. All circuital elements of FIG. 4 are identical to those of FIG. 3 and are designated by the same reference signs, except for the three MOS transistor $M_1$, $M_2$ and $M_3$ which are here replaced by respective bipolar NPN-type transistors designated by $N_1$, $N_2$ and $N_3$. The bipolar circuit works in an analogous manner to the circuit of FIG. 3. Furthermore, though the circuit as described is intended to be used in an output stage, the invention may be applied to any circuitry with similar problems.

The described resistors may also be replaced with controlled current sources.

In addition, all the details may be replaced with other technically equivalent ones.

We claim:

1. In a circuit including a driving block having an input receiving an input switching signal and an output generating a switching output voltage signal which switches between a low level and a high level, and a capacitive bootstrap circuit having a first terminal connected to said output of said driving block and a second terminal, a device for generating a floating reference voltage is connected between said output of said driving block and said second terminal of said capacitive bootstrap circuit, said device generating said floating reference voltage so as to follow said switching output voltage signal and avoid damage to said bootstrap circuit, said floating reference voltage switching to a low state, higher than said low level of said switching output voltage signal for charging said capacitive bootstrap circuit, when said switching output voltage signal switches to said low level, said floating reference voltage switching to a high state, near to said high level, when said switching output voltage signal switches to said high level.

2. In a circuit including a driving block having an input receiving an input switching signal and an output generating a switching output voltage signal, and a capacitive bootstrap circuit having a first terminal connected to said output of said driving block and a second terminal, a device for generating a floating reference voltage is connected between said output of said driving block and said second terminal of said capacitive bootstrap circuit, said floating reference voltage switching in accordance with said switching output voltage signal, wherein said device comprises Zener diode means having an anode and a cathode, said anode being connected to said output of said driving block, and a transistor having a source and a gate terminal, said gate terminal being connected to said cathode of said Zener diode means and to a reference potential line through first resistor means, said source terminal being connected to said second terminal of said capacitive bootstrap circuit and to said output of said driving block through control means controlling switching on and off of said transistor.

3. A device according to claim 2, wherein said control means for said transistor comprises further resistor means.

4. A device according to claim 2, wherein said capacitive bootstrap circuit defines a feedback connection interposed between said source terminal of said transistor and said output of said driving block, said bootstrap circuit including a further diode having an anode connected to said source terminal of said transistor and a cathode connected to said output through a bootstrap capacitor.

5. A device according to claim 2, wherein said transistor is a MOS transistor.

6. A device according to claim 2, wherein said Zener diode means comprises a plurality of Zener diodes connected in series.

7. A device according to claim 2, wherein said control means for said transistor comprise current source means.

8. A device according to claim 2, wherein said transistor is an NPN-type bipolar transistor.

9. An output stage, comprising a driving block interposed between a first reference potential line and a second reference potential line, said driving block having a signal input receiving an input switching signal, a reference input connected to a further reference potential line and an output generating an output switching signal which switches between a low level that is substantially equal to said second reference potential line and a high level that is substantially equal to said first potential reference line, and a capacitive bootstrap circuit connected between said output of said driving block and said further reference potential line, said stage including means for generating a floating reference voltage connected to said further reference potential line, said means generating said floating reference voltage so as to follow said output switching signal and avoid damage to said bootstrap circuit said floating reference voltage switching to a low state, higher than said low level of said switching output voltage signal for charging said capacitive bootstrap circuit, when said switching output voltage signal switches to said low level, said floating reference voltage switching to a high state, near to said high level, when said switching output voltage signal switches to said high level.

10. In a circuit including a driving block having an input receiving an input switching signal and an output generating a switching output voltage signal, said switching output voltage signal switching between a low level and a high level, and a capacitive bootstrap circuit having a first terminal connected to said output of said driving block and a second terminal, a device for generating a floating reference voltage is connected between said output of said driving block and said second terminal of said capacitive bootstrap circuit, said floating reference voltage switching to a low state for charging said capacitive bootstrap circuit when said switching output voltage signal switches to said low level, said low state being higher than said low level of said switching output voltage signal, and said floating reference voltage switching to a high state, when said switching output voltage signal switches to said high level, said high state being near to said high level, wherein said device comprises Zener diode means having an anode and a cathode, said anode being connected to said output of said driving block, and a transistor having a source and a gate terminal, said gate terminal being connected to said cathode of said Zener diode means and to a reference potential line through first resistor means, said source terminal being connected to said second terminal of said capacitive bootstrap circuit and to said output of said driving block through control means controlling switching on and off of said transistor.

11. An output stage, comprising a driving block interposed between a first reference potential line and a second reference potential line, said driving block having a signal input receiving an input switching signal, a reference input connected to a further reference potential line and an output generating an output switching signal which switches between a low level that is substantially equal to said second reference potential line and a high level that is substantially equal to said first potential reference line, and a capacitive bootstrap circuit including a bootstrap diode, said bootstrap circuit being connected between said output of said driving block and said further reference potential line, said stage including means for generating a floating reference voltage connected to said further reference potential line, said means generating said floating reference voltage so as to follow said output switching signal and minimize inverse bias voltage on said bootstrap diode, said floating reference voltage switching to a low state, higher than said low level of said switching output voltage signal for charging said capacitive bootstrap circuit, when said switching output voltage signal switches to said low level, said floating reference voltage switching to a high state, near to said high level, when said switching output voltage signal switches to said high level.

* * * * *